(12) United States Patent
Kim et al.

(10) Patent No.: US 7,551,491 B2
(45) Date of Patent: Jun. 23, 2009

(54) UNIT CELL OF A NON-VOLATILE MEMORY DEVICE, A NON-VOLATILE MEMORY DEVICE AND METHOD THEREOF

(75) Inventors: Won-joo Kim, Yongin-si (KR); Suk-pil Kim, Yongin-si (KR); Jae-woong Hyun, Yongin-si (KR); Yoon-dong Park, Yongin-si (KR); June-mo Koo, Yongin-si (KR)

(73) Assignee: Samsung Electroncs Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/715,404

(22) Filed: Mar. 8, 2007

(65) Prior Publication Data

US 2008/0025106 A1 Jan. 31, 2008

(30) Foreign Application Priority Data

Jul. 27, 2006 (KR) ...................... 10-2006-0070881

(51) Int. Cl.
*G11C 11/34* (2006.01)
(52) U.S. Cl. .............................. 365/185.28; 365/185.24
(58) Field of Classification Search ............ 365/185.28, 365/185.24
See application file for complete search history.

(56) References Cited

U.S. PATENT DOCUMENTS 6,888,755 B2 * 5/2005 Harari ................... 365/185.02

(Continued)

FOREIGN PATENT DOCUMENTS

EP 1164596 12/2001

(Continued)

OTHER PUBLICATIONS

EP Search Report dated Aug. 2, 2007.

(Continued)

*Primary Examiner*—Michael T Tran
(74) *Attorney, Agent, or Firm*—Harness, Dickey & Pierce, P.L.C.

(57) ABSTRACT

Unit cells of a non-volatile memory device and a method thereof are provided. In an example, the unit cell may include a first memory transistor and a second memory transistor connected to each other in series and further connected in common to a word line, the first and second memory transistors including first and second storage nodes, respectively, the first and second storage nodes configured to execute concurrent memory operations. In another example, the unit cell may include a semiconductor substrate in which first and second bit line regions are defined, first and second storage node layers respectively formed on the semiconductor substrate between the first and second bit line regions, a first pass gate electrode formed on the semiconductor substrate between the first bit line region and the first storage node layer, a second pass gate electrode formed on the semiconductor substrate between the second bit line region and the second storage node layer, a third pass gate electrode formed on the semiconductor substrate between the first and second storage node layers, a third bit line region formed in a portion of the semiconductor substrate under the third pass gate electrode and a control gate electrode extending across the first and second storage node layers. The example unit cells may be implemented within a non-volatile memory device (e.g., a flash memory device), such that the non-volatile memory device may include a plurality of example unit cells.

22 Claims, 7 Drawing Sheets

U.S. PATENT DOCUMENTS

| | | | |
|---|---|---|---|
| 6,925,007 B2 * | 8/2005 | Harari et al. | 365/185.15 |
| 7,023,739 B2 * | 4/2006 | Chen et al. | 365/185.28 |
| 2004/0070020 A1 * | 4/2004 | Fujiwara et al. | 257/314 |

FOREIGN PATENT DOCUMENTS

| | | |
|---|---|---|
| EP | 1256960 | 11/2002 |

OTHER PUBLICATIONS

European Search Report dated Nov. 21, 2008.

* cited by examiner

UNIT CELL OF A NON-VOLATILE MEMORY DEVICE, A NON-VOLATILE MEMORY DEVICE AND METHOD THEREOF

PRIORITY STATEMENT

This application claims the benefit of Korean Patent Application No. 10-2006-0070881, filed on Jul. 27, 2006, in the Korean Intellectual Property Office, the disclosure of which incorporated herein in its entirety by reference.

BACKGROUND OF THE INVENTION

1. Field of the Invention

Example embodiments of the present invention relate generally to a unit cell of a non-volatile memory device, a non-volatile memory device and method thereof, and more particularly to a non-volatile memory device including a plurality of unit cells, with each unit cell capable of performing concurrent memory operations at storage nodes included therein.

2. Description of the Related Art

Conventional non-volatile memory devices (e.g., flash memory devices) may include NAND type and/or NOR type structures. Conventional NAND type flash memory devices may use a Fouler-Nordheim (F-N) tunneling process. The F-N tunneling process may provide a relatively fast program operation speed, a relatively high program operation efficiency and an area of a cell allocated to each bit may be relatively small so as to achieve a higher degree of integration. However, in NAND type flash memory devices, achieving random access may be difficult. Thus, NAND type flash memory devices may be associated with lower speeds during read operations and increased difficulty in selecting particular memory cells during a program operation.

In contrast to NAND type flash memory devices, random access may be relatively easy to achieve in conventional NOR type flash memory devices. Accordingly, NOR type flash memory devices may be faster at performing read operations as well as having a higher degree of cell selectivity during a program operation. However, conventional NOR type flash memory devices may typically use a channel hot electron injection (CHEI) process. The CHEI process may be associated with lower program operation speeds, lower program operation efficiency and an area of a cell allocated to each bit may be relatively large such the degree of integration rate is relatively low.

Accordingly, a system designer selecting between conventional NOR and NAND type flash memory devices may typically take the relative advantages and disadvantages of the respective flash memory devices into consideration in order to optimize a particular memory system.

SUMMARY OF THE INVENTION

An example embodiment of the present invention is directed to a unit cell of a non-volatile memory device, including a first memory transistor and a second memory transistor connected to each other in series and further connected in common to a word line, the first and second memory transistors including first and second storage nodes, respectively, the first and second storage nodes configured to execute concurrent memory operations.

Another example embodiment of the present invention is directed to a method of operating a non-volatile memory device, including selecting at least one memory transistor among a plurality of memory transistors at which to perform a memory operation, the memory operation being one of a programming operation performed with a charge tunneling process, a read operation and an erase operation and performing the memory operation concurrently at each selected memory transistor, each of the plurality of memory transistors connected to each other in series and further connected in common to a word line, the first and second memory transistors further including first and second storage nodes.

Another example embodiment of the present invention is directed to a unit cell of a non-volatile memory device, including a semiconductor substrate in which first and second bit line regions are defined. first and second storage node layers respectively formed on the semiconductor substrate between the first and second bit line regions, a first pass gate electrode formed on the semiconductor substrate between the first bit line region and the first storage node layer, a second pass gate electrode formed on the semiconductor substrate between the second bit line region and the second storage node layer, a third pass gate electrode formed on the semiconductor substrate between the first and second storage node layers, a third bit line region formed in a portion of the semiconductor substrate under the third pass gate electrode and a control gate electrode extending across the first and second storage node layers.

Another example embodiment of the present invention is directed to a non-volatile memory device having attributes of both NAND type flash memory devices and NOR type flash memory devices.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will now be described, a non-volatile memory device according to example embodiments of the present invention may include, for example, an Electrically Erasable Programmable Read Only Memory (EEPROM) device and a flash memory device, for example.

Figure 1:
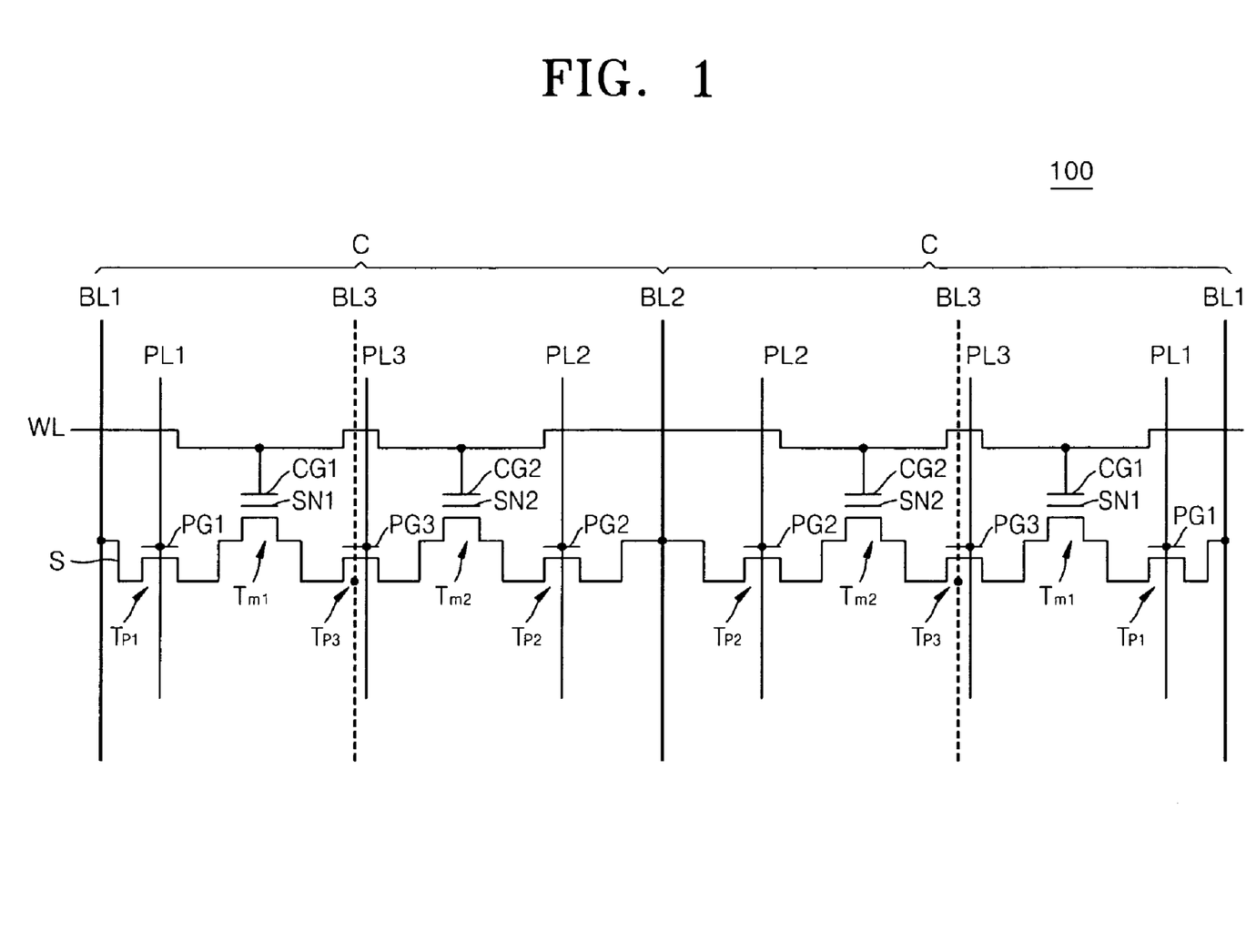
FIG. 1 is a circuit diagram of a non-volatile memory device according to an example embodiment of the present invention.

FIG. 1 is a circuit diagram of a non-volatile memory device 100 according to an example embodiment of the present invention.

In the example embodiment of FIG. 1, the non-volatile memory device 100 may include a pair of unit cells C which may be serially connected. While two unit cells C are illustrated in the example embodiment of FIG. 1, it is understood that the non-volatile memory device 100 may scale so as to include any number of unit cells C in other example embodiments of the present invention. Thus, in an example the non-volatile memory device 100 may include only one unit cell C, three or more unit cells C, etc. Hereinafter, an example configuration of a representative unit cell C will be described in greater detail.

In the example embodiment of FIG. 1, the unit cell C may include first and second memory transistors $T_{m1}$ and $T_{m2}$ and first, second and third pass transistors $T_{p1}$, $T_{p2}$ and $T_{p3}$, which may be arranged in a string S. First and second bit lines BL1 and BL2 may be connected to respective ends of the string S constituting the unit cell C, and a word line WL may control the first and second memory transistors $T_{m1}$ and $T_{m2}$ in common.

In the example embodiment of FIG. 1, the first and second bit lines BL1 and BL2 may be arranged so as to cross the string S. That is, a direction in which the first and second bit lines BL1 and BL2 extend and a direction in which the string S extends may not be aligned, or parallel, with each other. The first and second memory transistors $T_{m1}$ and $T_{m2}$ included in the string S may be positioned between the first and second bit lines BL1 and BL2.

In the example embodiment of FIG. 1, the first memory transistor $T_{m1}$ may include a first control gate CG1 and a first storage node SN1, and the second memory transistor $T_{m2}$ may include a second control gate CG2 and a second storage node SN2. For example, the first and second memory transistors $T_{m1}$ and $T_{m2}$ may be arranged as a flash memory device. In a further example, the flash memory device may include a silicon/oxide/nitride/oxide/silicon (SONOS) memory device. Accordingly, the first and second storage nodes SN1 and SN2 may operate as a floating gate node and/or a charge trapping node. The first and second control gates CG1 and CG2 may be used to control the operations of the first and second memory transistors $T_{m1}$ and $T_{m2}$.

In the example embodiment of FIG. 1, the first, second and third pass transistors $T_{p1}$, $T_{p2}$ and $T_{p3}$ may be included in the string S between the first bit line BL1 and the first memory transistor $T_{m1}$, in the string S between the second bit line BL2 and the second memory transistor $T_{m2}$ and in the string S between the first and second memory transistors $T_{m1}$ and $T_{m2}$, respectively. Accordingly, the first pass transistor $T_{p1}$ may control whether a power of the first bit line BL1 is applied to the first memory transistor $T_{m1}$ and the second pass transistor $T_{p2}$ may control whether a power of the second bit line BL2 is applied to the second memory transistor $T_{m2}$. The third pass transistor $T_{p3}$ may control an electrical connection between the first and second memory transistors $T_{m1}$ and $T_{m2}$.

In the example embodiment of FIG. 1, the first, second and third pass transistors $T_{p1}$, $T_{p2}$ and $T_{p3}$ may include first, second and third pass gates PG1, PG2 and PG3, respectively. For example, the first, second and third pass transistors $T_{p1}$, $T_{p2}$ and $T_{p3}$ may be arranged as a conventional MOS field effect transistor and the first, second and third pass gates PG1, PG2 and PG3 may control whether each of the first, second and third pass transistors $T_{p1}$, $T_{p2}$ and $T_{p3}$, respectively, is turned-on or turned-off.

In an alternative example to the example embodiment of FIG. 1, a first pass line PL1, a second pass line PL2 and a third pass line PL3, each of which may be connected to the first pass gate PG1, the second pass gate PG2 and the third pass gate PG3, respectively, may be provided. The first, second and third pass lines PL1, PL2 and PL3 may be arranged to cross a string S. Thus, in a modified example of the example embodiment of FIG. 1, the first, second and third pass lines PL1, PL2 and PL3 may be omitted and power may be directly applied to the first, second and third pass gates PG1, PG2 and PG3.

Returning to the example embodiment of FIG. 1, the third bit line BL3 may be connected to a channel of the third pass transistor $T_{p3}$. Thus, the third bit line BL3 may be driven in the state where the third pass transistor $T_{p3}$ is turned on. A word line WL may be connected to the first and second control gates CG1 and CG2 of the first and second memory transistors $T_{m1}$ and $T_{m2}$ in common. The word line WL may extend across the first, second and third bit lines BL1, BL2 and BL3, the first, second and third pass gates PG1, PG2 and PG3) and the first, second and third pass lines PL1, PL2 and PL3.

In the example embodiment of FIG. 1, the structure of unit cells C arranged on the string S may be symmetrical. The word line WL may be shared among the unit cells C of the string S. Furthermore, the first bit line BL1 and/or the second bit line BL2 may be shared in two adjacent unit cells C serially connected to the string S. The second bit line BL2 shared in the two unit cells C may be illustrated in FIG. 1.

In the example embodiment of FIG. 1, in an example, the non-volatile memory device 100 may be distinguished from a conventional NAND type flash memory device in that the first and second control gates CG1 and CG2 of the serially-connected first and second memory transistors $T_{m1}$ and $T_{m2}$ may be connected to a single word line WL. In another example, the non-volatile memory device 100 may be distinguished from a conventional NOR type flash memory device in that the first and second memory transistors $T_{m1}$, $T_{m2}$ connected to the single word line WL may be serially connected to each other. Further, the non-volatile memory device 100 may be similar to a conventional NAND type flash memory device in that the first and second memory transistors $T_{m1}$ and $T_{m2}$ may be serially connected to each other and may be respectively driven. The non-volatile memory device 100 may be similar to that of a conventional NOR type flash memory device in that the first and second memory transistors $T_{m1}$ and $T_{m2}$ may separately access the first, second and third bit lines BL1, BL2 and BL3, respectively. Thus, the non-volatile memory device 100 of FIG. 1, in an example, may combine at least some of the respective advantages of conventional NAND type flash memory devices and conventional NOR type flash memory devices.

Figure 2:
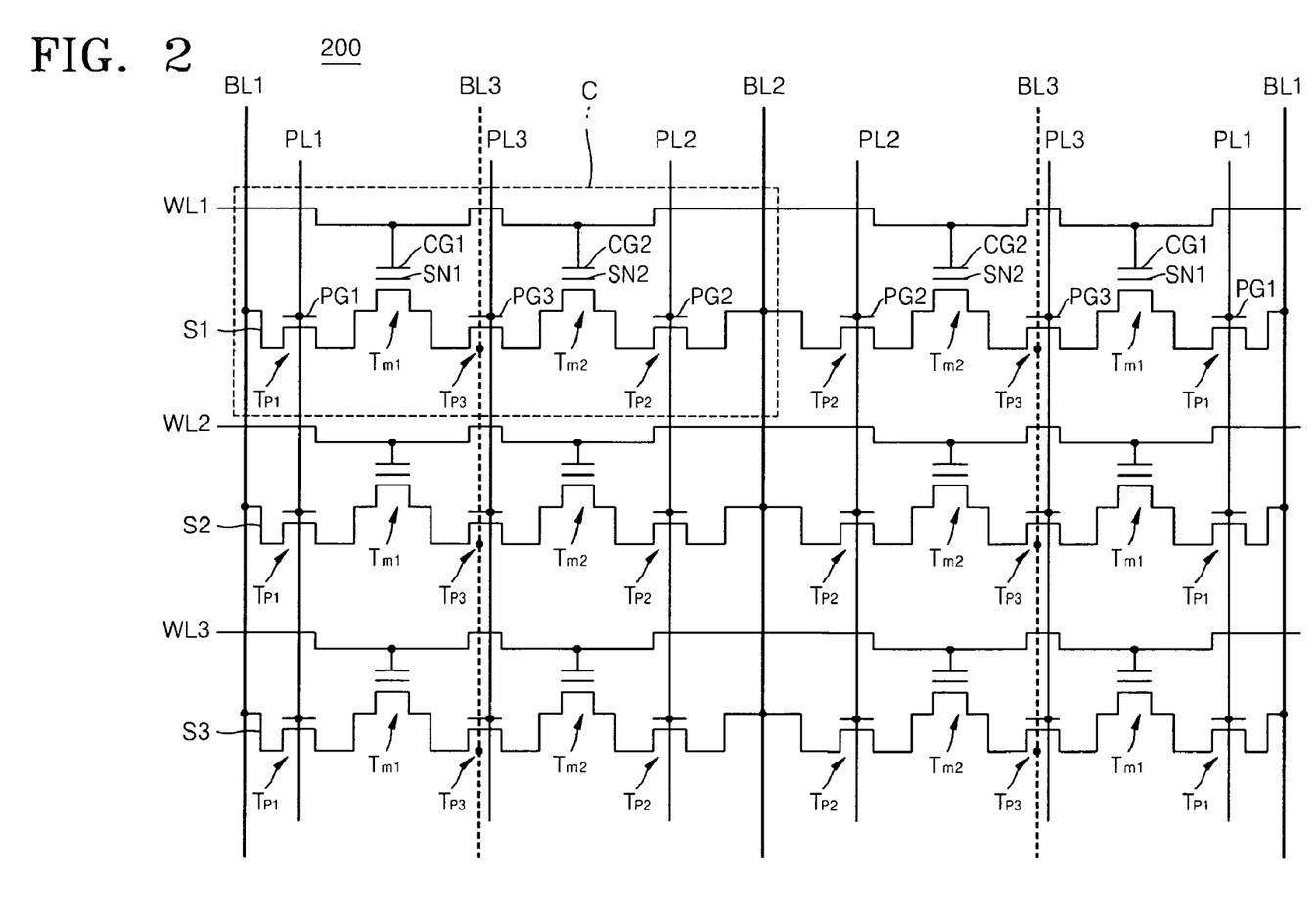
FIG. 2 is a circuit diagram of another non-volatile memory device according to another example embodiment of the present invention.

FIG. 2 is a circuit diagram of a non-volatile memory device 200 according to another example embodiment of the present invention. In an example, the non-volatile memory device 200 of FIG. 2 may be an array structure in which the non-volatile memory device 100 of FIG. 1 may be arranged within a given row. Thus, like elements present in each of the example embodiments of FIG. 1 and FIG. 2 will not be described further for the sake of brevity.

In the example embodiment of FIG. 2, first, second and third word lines WL1, WL2 and WL3 may refer to the word line WL of FIG. 1 and first, second and third strings S1, S2 and S3 may refer to the string S of FIG. 1. The first, second and third strings S1, S2 and S3 may be arranged in a plurality of rows and the first, second and third word lines WL1, WL2 and WL3 may likewise be arranged in a plurality of rows.

In the example embodiment of FIG. 2, the unit cells C may be arranged in an array shape. The first and second memory transistors $T_{m1}$ and $T_{m2}$ in the unit cells C arranged in the same row may be serially connected, as described in FIG. 1. However, the first and second memory transistors $T_{m1}$ and $T_{m2}$ in the unit cells C arranged in other rows may not be directly (e.g., serially) connected to each other. The first, second and third bit lines BL1, BL2 and BL3 and the first, second and third pass lines PL1, PL2 and PL3 may be shared in first, second and third strings S1, S2 and S2, respectively, and accordingly, may be shared in the unit cells C arranged in other rows.

An example operation of the non-volatile memory devices 200 of FIG. 2 will now be described in greater detail with respect to the example embodiments of FIGS. 3 through 6.

FIGS. 3 through 6 illustrate an operation of the non-volatile memory device 200 of FIG. 2 according to another example embodiment of the present invention. However, it will be readily understood that the example operation illustrated in FIGS. 3 through 6 may likewise be applied within the non-volatile memory device 100 of FIG. 1.

Figure 3:
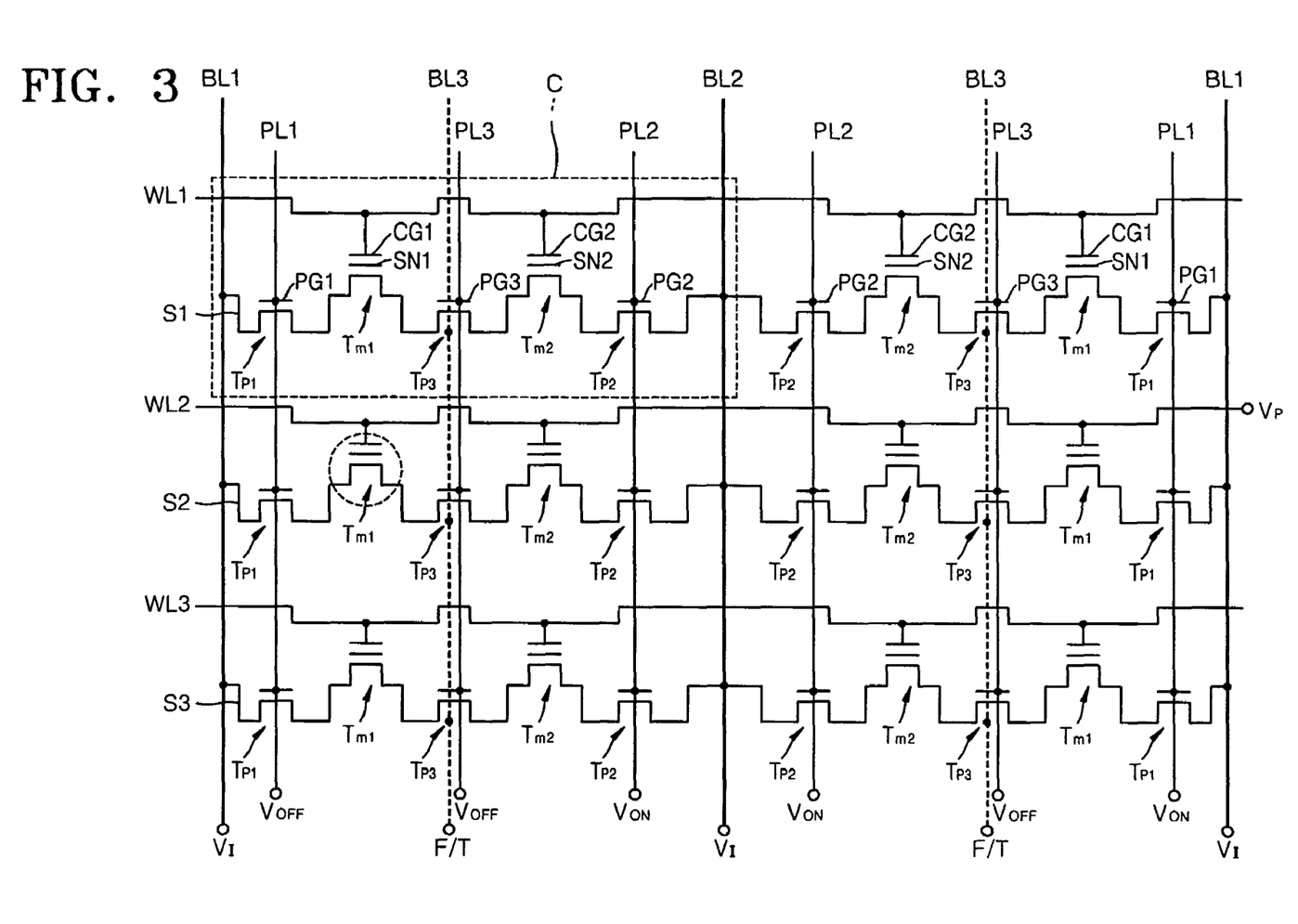
FIG. 3 is a circuit diagram illustrating a program operation of the non-volatile memory device of FIG. 2 according to another example embodiment of the present invention.

FIG. 3 is a circuit diagram illustrating a program operation of the non-volatile memory device 200 of FIG. 2 according to another example embodiment of the present invention. In the example embodiment of FIG. 3, data may be programmed using an F-N tunneling process by selecting a first memory transistor $T_{m1}$ marked by a dotted line in FIG. 3. In order to select the second string S2, a program voltage $V_p$ may be applied to a second word line WL2. A turn-off voltage $V_{OFF}$ may be applied to the third pass line PL3 and the third bit line BL3 may be floated (e.g., indicated by by F/T) so that the first and second memory transistors $T_{m1}$ and $T_{m2}$ may be electrically separated from each other. A ground voltage (e.g., approximately 0V) may be applied to bodies of the first and second memory transistors $T_{m1}$ and $T_{m2}$.

In the example embodiment of FIG. 3, a program prevention voltage $V_I$ may be applied to the first and second bit lines BL1 and BL2, a turn-off voltage $V_{OFF}$ may be applied to a first pass line PL1 and a turn-on voltage $V_{ON}$ may be applied to a second pass line PL2. As a result, a first pass transistor $T_{p1}$ may be turned on and the second pass transistor $T_{p2}$ may be turned off. The program prevention voltage $V_I$ may be selectively applied to a channel of the second memory transistor $T_{m2}$. Accordingly, charges may be injected into a first storage node SN1 at a channel of the first memory transistor $T_{m1}$ using a tunneling process (e.g., a F-N tunneling process) while tunneling of the charges may be reduced (e.g., suppressed) in the second memory transistor $T_{m2}$.

In the example embodiment of FIG. 3, while a program operation performed within the first memory transistor 1 $T_{m1}$ has been described with respect to the example embodiment of FIG. 3, it is understood that program operations performed at other memory transistors (e.g., second memory transistor $T_{m2}$) may be performed in a similar manner. For example, the turn-on voltage $V_{ON}$ may be applied to the first pass line PL1 and the turn-off voltage $V_{OFF}$ may be applied to the second pass line PL2 so that data may be selectively programmed in the second memory transistor $T_{m2}$. In another example, the turn-off voltage $V_{OFF}$ may be applied to both the first and second pass lines PL1 and PL2 so that data may be concurrently (e.g., simultaneously) programmed in the first and second memory transistors $T_{m1}$ and $T_{m2}$.

In the example embodiment of FIG. 3, it is understood that program operations may be performed within other unit cells C of the non-volatile memory device 200 and, accordingly, corresponding first and second memory transistors $T_{m1}$ and $T_{m2}$ in other unit cells C may likewise be concurrently (e.g., simultaneously) programmed. In addition, it will be apparent that a program voltage $V_p$ may be applied to first and third word lines WL1 and WL3 so that unit cells C in other rows may be selected.

Figure 4:
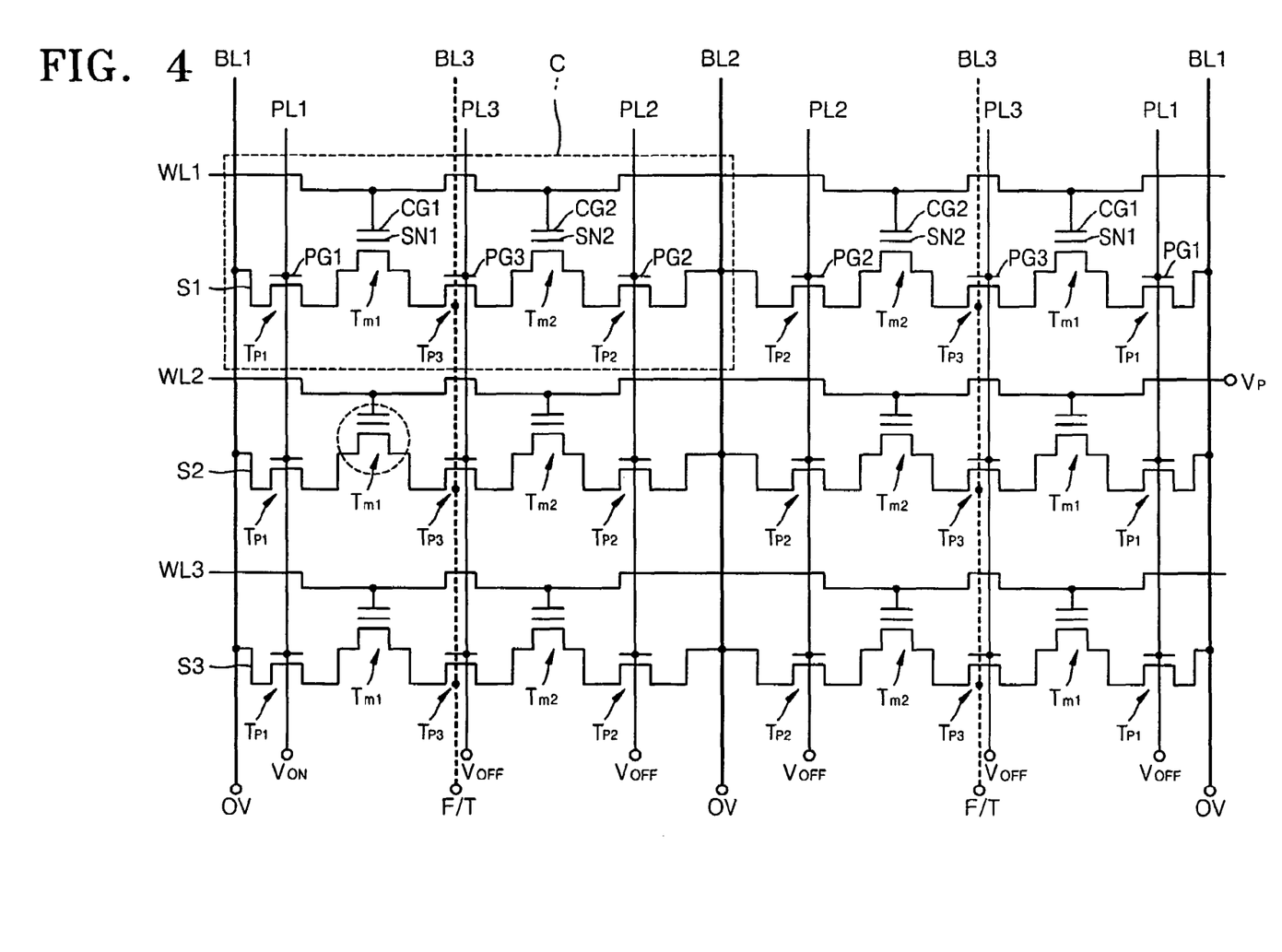
FIG. 4 is a circuit diagram illustrating a program operation of the non-volatile memory device of FIG. 2 according to another example embodiment of the present invention.

FIG. 4 is a circuit diagram illustrating a program operation of the non-volatile memory device 200 of FIG. 2 according to another example embodiment of the present invention. The program operation of FIG. 4 will now be described as performed within the first memory transistor $T_{m1}$ marked by a dotted line. Similar to the example embodiment of FIG. 3, the example embodiment of FIG. 4 may use a F-N tunneling process. However, in the example embodiment of FIG. 4, the first and second memory transistors $T_{m1}$ and $T_{m2}$ may be selected by using a localized self-boosting (LSB) process. Thus, if a pulse type program voltage is applied, tunneling of charges may selectively occur in a portion in which a channel or body may be sufficiently wide so that the charges may be supplied within a shorter period of time.

In the example embodiment of FIG. 4, in order to select a second string S2, a pulse type program voltage may be applied to a second word line WL2. A turn-off voltage $V_{OFF}$ may be applied to the third pass line PL3 and the third bit line BL3 may be floated (e.g., indicated by F/T) so that the first and second memory transistors $T_{m1}$ and $T_{m2}$ may be electrically separated from each other.

In the example embodiment of FIG. 4, a ground voltage (e.g., approximately 0V) may be applied to the first and second bit lines BL1 and BL2, a turn-on voltage $V_{ON}$ may be applied to a first pass line PL1 and a turn-off voltage $V_{OFF}$ may be applied to a second pass line PL2. Charges may be supplied to a channel of the first memory transistor $T_{m1}$ from a channel of a first pass transistor $T_{p1}$. However, a channel of the second memory transistor $T_{m2}$ may be disconnected from a channel of the second pass transistor $T_{p2}$. Thus, data programming may be selective only within the first memory transistor $T_{m1}$.

As will be appreciated by one of ordinary skill in the art, the example program operations illustrated in FIGS. 3 and 4 combine certain advantages typically exclusively associated with either NOR type or NAND type flash memory devices. Thus, F-N tunneling may be used such that a program efficiency is higher, a program speed is faster, while random access may still be used. A program interference caused by the first and second pass transistors $T_{p1}$ and $T_{p2}$ may thereby be reduced. In addition, data may be programmed concurrently (e.g., simultaneously) in a plurality of memory transistors (e.g., $T_{m1}$ and $T_{m2}$) such that a page program may be achieved.

Figure 5:
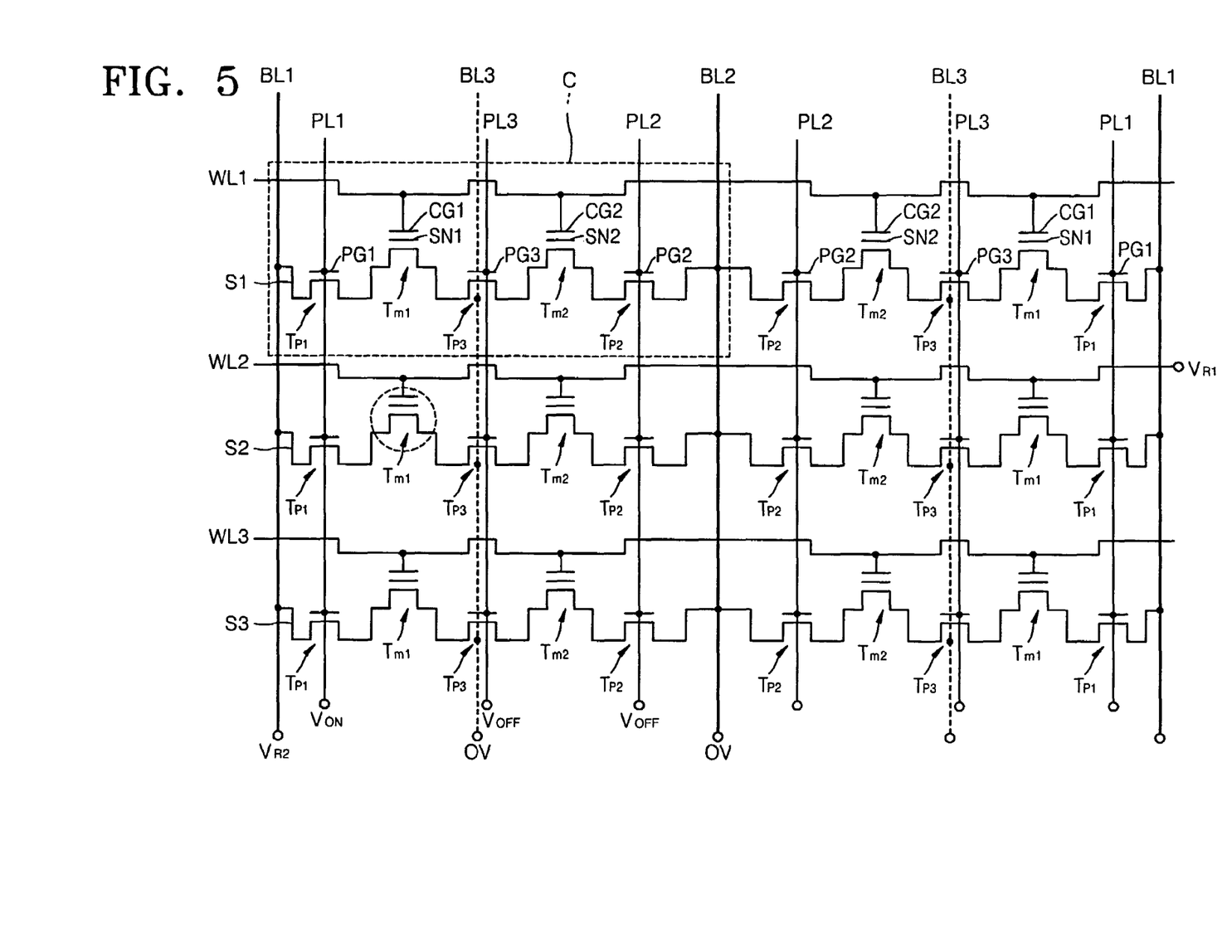
FIG. 5 is a circuit diagram illustrating a read operation performed within the non-volatile memory device of FIG. 2 according to another example embodiment of the present invention.

FIG. 5 is a circuit diagram illustrating a read operation performed within the non-volatile memory device 200 of FIG. 2 according to another example embodiment of the present invention. In particular, FIG. 5 illustrates a read operation performed at the first memory transistor $T_{m1}$.

In the example embodiment of FIG. 5, a first read voltage $V_{R1}$ may be applied to a second word line WL2, so as to select a second row. A ground voltage (e.g., approximately 0V) may be applied to a third bit line BL3 and a turn-on voltage $V_{ON}$ may be applied to a third pass line PL3. A second read voltage $V_{R2}$ may be applied to a first bit line BL1 and a turn-on voltage $V_{ON}$ may be applied to a first pass line PL1. As such, a current flow may be transferred to the third bit line BL3 from the first bit line BL1 and data of the first memory transistor $T_{m1}$ may be read based on the current flow.

In the example embodiment of FIG. 5, a read operation of the second memory transistor $T_{m2}$ may be performed in a manner similar to that the first memory transistor $T_{m1}$. For example, a second read voltage $V_{R2}$ may be applied to the second bit line BL2 instead of the first bit line BL1 and a turn-on voltage $V_{ON}$ may be applied to the second pass line PL2 instead of the first pass line PL1. As such, a current flow may be transferred to the third bit line BL3 from the second bit line BL2. Further, the first read voltage $V_{R1}$ may be applied to other word lines (e.g., WL1 and WL3) instead of only the second word line WL2 as above-described, such that data in unit cells C arranged in other rows may be read.

Figure 6:
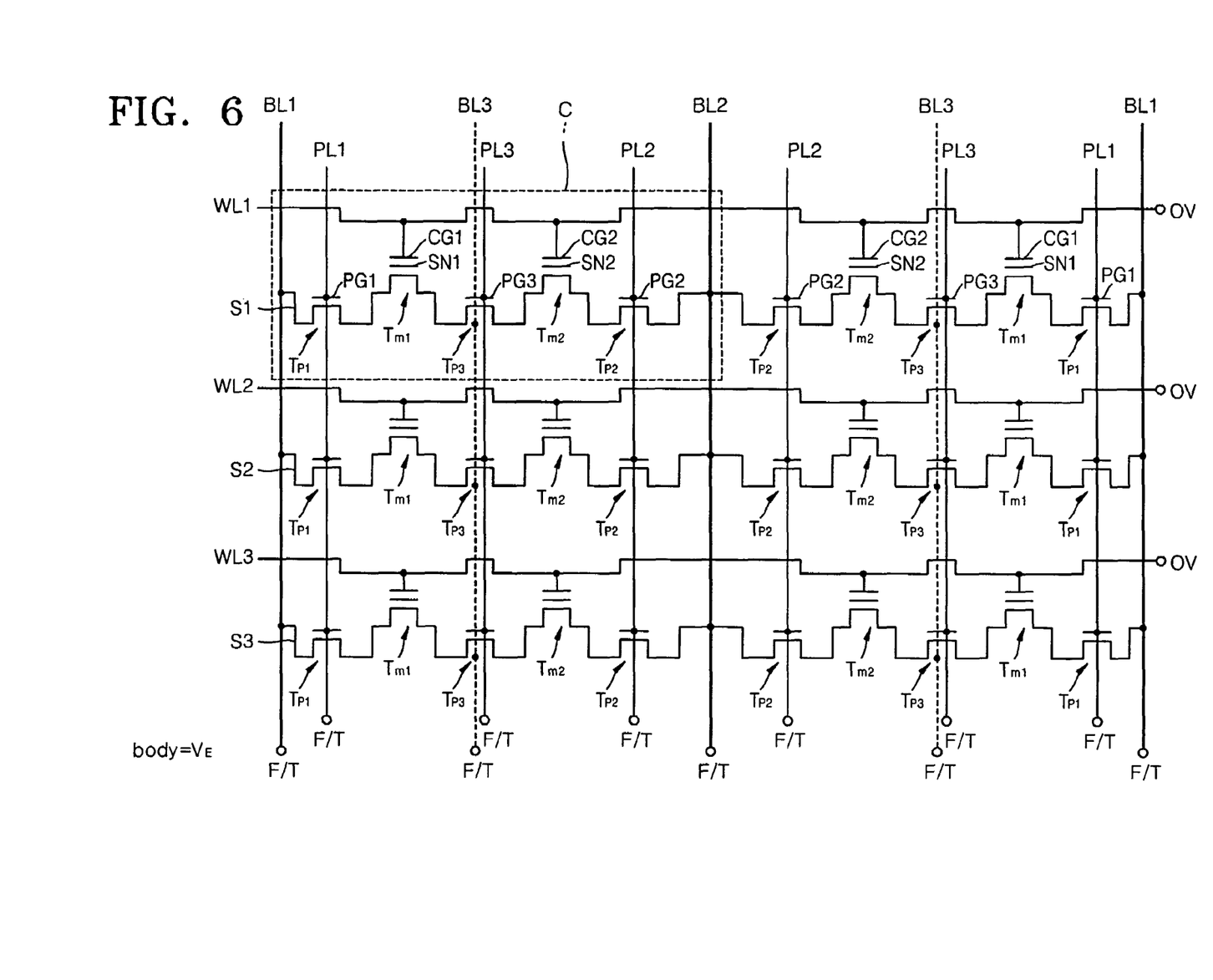
FIG. 6 is a circuit diagram illustrating an erase operation performed within the non-volatile memory device of FIG. 2 according to another example embodiment of the present invention.

FIG. 6 is a circuit diagram illustrating an erase operation performed within the non-volatile memory device 200 of FIG. 2 according to another example embodiment of the present invention.

In the example embodiment of FIG. 6t, a block erase process which may erase a given number of unit cells C concurrently (e.g., simultaneously) may be performed. A ground voltage (e.g., approximately 0V) may be applied to first, second and third word lines WL1, WL2 and WL3 and an erase voltage $V_E$ may be applied to bodies of first and second memory transistors $T_{m1}$ and $T_{m2}$. Each of the first, second and third bit lines BL1, BL2 and BL3 and each of the first, second and third pass lines PL1, PL2 and PL3 may be floated (e.g., indicated by F/T). Data may thereby be programmed in first and second storage nodes SN1 and SN2 and may be erased concurrently (e.g., simultaneously).

Figure 7:
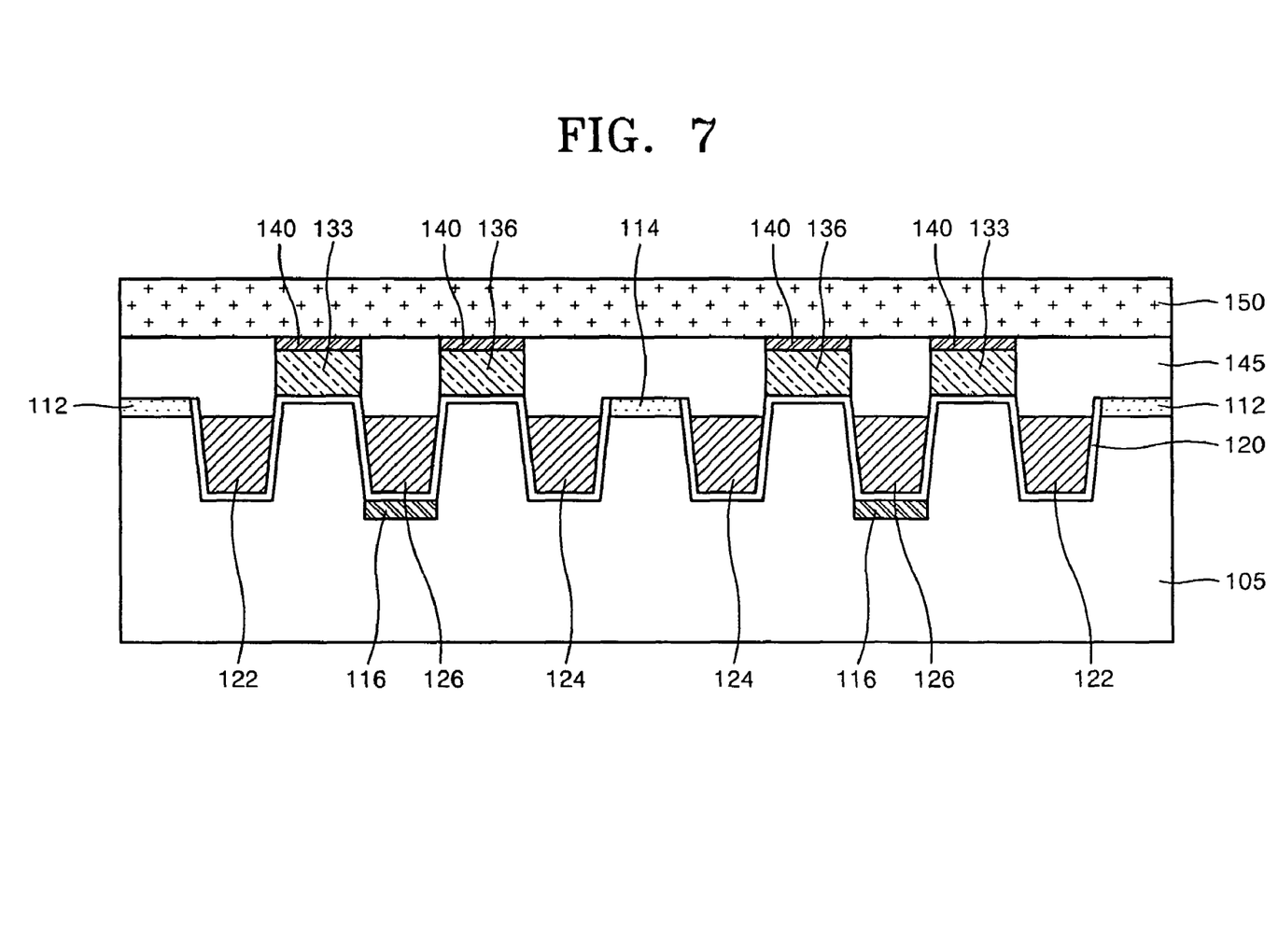
FIG. 7 is a cross-sectional view of another non-volatile memory device according to another example embodiment of the present invention.

FIG. 7 is a cross-sectional view of a non-volatile memory device according to another example embodiment of the present invention. In an example, the non-volatile memory device of FIG. 7 may correspond to the non-volatile memory device 100 of FIG. 1 and/or the non-volatile memory device 200 of FIG. 2. Accordingly, a further description of like elements within FIG. 7 which have already been described with respect to FIGS. 1 and/or 2 has been omitted for the sake of brevity.

In the example embodiment of FIG. 7, first and second bit line regions 112 and 114 may be formed in a semiconductor substrate 105. In an example, impurities may be doped into the semiconductor substrate 105, thereby forming the first and second bit line regions 112 and 114. In another example, the semiconductor substrate 105 and the first and second bit line regions 112 and 114 may include impurities of opposite conductivity types. The first and second bit line regions 112 and 114 may correspond to the first and second bit lines BL1 and BL2 of FIG. 1.

In the example embodiment of FIG. 7, first and second storage node layers 133 and 136 may be formed on the semiconductor substrate 105 between the first and second bit line regions 112 and 114, respectively. For example, the first and second storage node layers 133 and 136 may include at least one layer including one or more of a polysilicon layer, a silicon nitride layer, silicon or metal dots and silicon or metal nano-crystals. A gate insulating layer 120 may be interposed between each of the first and second storage node layers 133 and 136 and the semiconductor substrate 105. The first and second storage node layers 133 and 136 may correspond to each of the first and second storage nodes SN1 and SN2 of FIG. 1 so as to respectively form the first and second memory transistors $T_{m1}$ and $T_{m2}$ of FIG. 1.

In the example embodiment of FIG. 7, first, second and third pass gate electrodes 122, 124 and 126 may be formed on the semiconductor substrate 105 between the first bit line region 112 and the first storage node layer 133, between the second bit line region 114 and the second storage node layer 136 and between the first and second storage node layers 133 and 136. A gate insulating layer 120 may be interposed between each of the first, second and third pass gate electrodes 122, 124 and 126 and the semiconductor substrate 105. The first, second and third pass gate electrodes 122, 124 and 126 may correspond to the first, second and third pass gates PG1, PG2 and PG3 of FIG. 1 so as to respectively form the first, second and third transistors $T_{p1}$, $T_{p2}$, $T_{p3}$ of FIG. 1.

in the example embodiment of FIG. 7, in an example, the first, second and third pass gate electrodes 122, 124 and 126 may be recessed into the semiconductor substrate 105. In an example, a channel region under the first and second storage node layers 133 and 136 and a channel region under the first, second and third gate electrodes 122, 124 and 126 may be connected by channels such that an additional impurity region (e.g., a source region or drain region) need not be included. Thus, the integration rate of the non-volatile memory device of FIG. 7 may be increased.

In another example embodiment of the present invention, referring to FIG. 7, the first, second and third pass gate electrodes 122, 124 and 126 may be formed in a planar shape. In an example, an impurity region may be formed to a given size between each of the first, second and third pass gate electrode 122,124 and 126 and each of the first and second storage nodes 133 and 136.

In the example embodiment of FIG. 7, the third bit line region 116 may be formed in a portion of the semiconductor substrate 106 under the third pass gate electrode 126. For example, the third bit line region 116 may include a channel region of the third pass gate electrode 126. The third bit line region 116 may correspond to the third bit line BL3 of FIG. 1. A control gate electrode 150 may be disposed to extend across the first and second storage node layers 133 and 136. In an example, the control gate electrode 150 may be used as a word line (e.g., WL of FIG. 1) and concurrently (e.g., simultaneously) may be used as control gates (e.g., CG1 and CG2 of FIG. 1). A blocking dielectric film 140 may be interposed between the control gate electrode 150 and each of the first and second storage node layers 133 and 136. An interlevel dielectric (ILD) film 145 may be interposed between the control gate electrode 150 and the semiconductor substrate 105.

In the example embodiment of FIG. 7, the non-volatile memory device may be divided into two unit cells C (e.g., as described above with respect to FIG. 1). In an example, the control gate electrode 150 may be shared in the two unit cells C. Furthermore, the second bit line region 114 may be positioned between the two unit cells C may be shared in the unit cells. In addition, the non-volatile memory device of FIG. 7 may be arranged with an array arrangement structure, for example, as illustrated in the example embodiment of FIG. 2.

In a further example, the non-volatile memory device illustrated of FIG. 7 may operate in a manner similar to that described above with respect to the example embodiments of FIG. 3 through, and accordingly a further description of the operation of the non-volatile memory device of FIG. 7 has been omitted for the sake of brevity.

Example embodiments of the present invention being thus described, it will be obvious that the same may be varied in many ways. For example, while the example embodiments are above described as directed to flash memory devices, it will be readily appreciated that other example embodiments of the present invention may be directed to any well-known non-volatile memory device.

Such variations are not to be regarded as a departure from the spirit and scope of example embodiments of the present invention, and all such modifications as would be obvious to one skilled in the art are intended to be included within the scope of the following claims.

What is claimed is:

1. A unit cell of a non-volatile memory device, comprising:
a first memory transistor including a first storage node;
a second memory transistor including a second storage node; and
a single transistor connected between the first memory transistor and the second memory transistor;
first and second bit lines intersecting a string, the string including the first and second memory transistors positioned between the intersections of the first and second bit lines, with the first and second memory transistors including first and second control gates, respectively;
a first pass transistor included in the string between the first bit line and the first memory transistor and including a first pass gate;
a second pass transistor included in the string between the second memory transistor and the second bit line and including a second pass gate;
a third pass transistor included in the string between the first and second memory transistors and including a third pass gate, where the third pass transistor is the single transistor;
a third bit line connected to a channel of the third pass transistor; and
a word line connected to the control gate of each of the first and second memory transistors in common, wherein
the first memory transistor and the second memory transistor are connected to each other in series and further connected in common to the word line, and
the first and second storage nodes are configured to execute concurrent memory operations.

2. The unit cell of claim 1, wherein the word line extends across the first, second and third bit lines.

3. The unit cell of claim 1, wherein the first, second and third pass gates extend across the word line.

4. The unit cell of claim 1, wherein the first and second memory transistors are arranged to form a unit cell for a flash memory device.

5. The unit cell of claim 4, wherein the storage node of each of the first and second memory transistors operates as a floating gate node or a charge trapping node.

6. A non-volatile memory device, comprising:
a plurality of unit cells connected to each other in series configured as the unit cell of claim 1, each of the plurality of unit cells sharing the common word line and arranged on the string.

7. The non-volatile memory device of claim 6, wherein at least one of the first and second bit lines is shared by physically adjacent unit cells among the plurality of unit cells.

8. A non-volatile memory device, comprising:
a plurality of unit cells arranged in a plurality of rows, each of the plurality of unit cells configured as the unit cell of claim 1;
a first pass line connecting the first pass gates in each of the plurality of unit cells arranged in common;
a second pass line connecting the second pass gates in each of the plurality of unit cells arranged in common; and
a third pass line connecting the third pass gates in each of the plurality of unit cells arranged in common,
wherein each of the first, second and third bit lines are shared by each of the plurality of unit cells.

9. A method of operating a non-volatile memory device, comprising:
selecting at least one memory transistor among a plurality of memory transistors at which to perform a memory operation, the memory operation being a programming operation performed with a charge tunneling process; and
performing the memory operation concurrently at each selected memory transistor, each of the plurality of memory transistors connected to each other in series and further connected in common to a word line, the first and second memory transistors further including first and second storage nodes, wherein the programming operation includes, applying a program voltage to the word line, applying a program prevention voltage to first and second bit lines, applying a turn-off voltage to one of the first and second pass gates corresponding to the first and second bit lines, respectively, applying a turn-off voltage to a third pass gate corresponding to a third bit line, and applying a turn-on voltage to the other of the first and second pass gates.

10. The method of claim 9, wherein a single pass gate is included between the first memory transistor and the second memory transistor.

11. A method of operating a non-volatile memory device, comprising:

selecting at least one memory transistor among a plurality of memory transistors at which to perform a memory operation, the memory operation being a programming operation performed with a charge tunneling process; and performing the memory operation concurrently at each selected memory transistor, each of the plurality of memory transistors connected to each other in series and further connected in common to a word line, the first and second memory transistors further including first and second storage nodes, wherein the programming operation includes;

applying a program voltage to the word line, applying a ground voltage to first and second bit lines, applying a turn-on voltage to one of the first and second pass gates corresponding to the first and second bit lines, respectively, applying a turn-off voltage to a third pass gate corresponding to a third bit line, and applying a turn-off voltage to the other of the first and second pass gates.

12. The method of claim 11, wherein a single pass gate is included between the first memory transistor and the second memory transistor.

13. A method of operating a non-volatile memory device, comprising:

selecting at least one memory transistor among a plurality of memory transistors at which to perform a memory operation, the memory operation being a read operation; and performing the memory operation concurrently at each selected memory transistor, each of the plurality of memory transistors connected to each other in series and further connected in common to a word line, the first and second memory transistors further including first and second storage nodes, wherein the read operation includes, applying a first read voltage to the word line, applying a second read voltage to at least one of first and second bit lines, and applying a ground voltage to a third bit line.

14. The method of claim 13, wherein a single pass gate is included between the first memory transistor and the second memory transistor.

15. A unit cell of a non-volatile memory device, comprising:

a semiconductor substrate in which first and second bit line regions are defined;

first and second storage node layers respectively formed on the semiconductor substrate between the first and second bit line regions;

a first pass gate electrode formed on the semiconductor substrate between the first bit line region and the first storage node layer;

a second pass gate electrode formed on the semiconductor substrate between the second bit line region and the second storage node layer;

a single gate electrode formed on the semiconductor substrate between the first and second storage node layers, where the single gate electrode is the third gate electrode;

a third bit line region formed in a portion of the semiconductor substrate under the third pass gate electrode; and a control gate electrode extending across the first and second storage node layers.

16. The unit cell of claim 15, wherein the first and second bit line regions are formed by doping impurities into the semiconductor substrate.

17. The unit cell of claim 15, wherein the third bit line region includes a channel region formed by the third pass gate electrode.

18. The unit cell of claim 15, wherein the first, second and third pass gate electrodes are recessed into the semiconductor substrate.

19. The unit cell of claim 15, wherein the first and second storage node layers include at least one of a polysilicon layer, a silicon nitride layer, silicon or metal dots and silicon or metal nano-crystals.

20. The unit cell of claim 15, wherein the control gate electrode is used as a word line.

21. A non-volatile memory device, comprising:

a plurality of unit cells connected to each other in series configured as the unit cell of claim 15, each of the plurality of unit cells sharing at least the control gate electrode in common.

22. The non-volatile memory device of claim 21, wherein at least one of the first and second bit line regions are shared by at least one pair of physically adjacent unit cells among the plurality of unit cells.

* * * * *